United States Patent [19]
Huth et al.

[11] Patent Number: 5,977,776
[45] Date of Patent: Nov. 2, 1999

[54] CIRCUIT BOARD TESTING METHOD

[75] Inventors: Ralf Huth, Eningen; Uwe Rothaug, Marktheidenfeld, both of Germany

[73] Assignee: atg Test Systems GmbH, Wertheim, Germany

[21] Appl. No.: 09/004,241

[22] Filed: Jan. 8, 1998

[51] Int. Cl.$^6$ .................................................. G01R 31/02
[52] U.S. Cl. .......................................... 324/537; 324/754
[58] Field of Search .................................. 324/537, 754, 324/757, 761

[56] References Cited

U.S. PATENT DOCUMENTS

| | | | |
|---|---|---|---|
| 4,471,298 | 9/1984 | Frohlich | 324/757 |
| 5,202,640 | 4/1993 | Schaaf et al. | 324/537 |
| 5,469,064 | 11/1995 | Kerschner et al. | 324/537 |
| 5,696,450 | 12/1997 | Itoh | 324/537 |
| 5,786,697 | 7/1998 | Khazam et al. | 324/537 |

*Primary Examiner*—Diep N. Do
*Attorney, Agent, or Firm*—Hamilton, Brook, Smith & Reynolds, P.C.

[57] ABSTRACT

The invention relates to a circuit board testing method, wherein an array of several circuits of a circuit board are short-circuited and further circuits are short-circuit tested by applying a high test voltage relative to said array of circuits, as a result of which the number of tests, which are normally highly time-intensive due to the high voltages, is drastically reduced since the further circuits do not need to be tested discretely relative to each circuit of the circuit array.

18 Claims, 3 Drawing Sheets

CIRCUIT BOARD TESTING METHOD

BACKGROUND OF THE INVENTION

After circuit boards have been manufactured but prior to the population of the boards with discrete electrical components and integrated circuits, it is common to test the circuits in the boards to ensure they have been properly formed.

Known devices for testing unpopulated circuit boards are generally divided into two groups: 1) devices using an adapter that contacts simultaneously to all circuit test points of the circuit board; and 2) so-called finger testing devices or finger testers that sequentially scan individual test points of the circuit boards using two or more test fingers.

Irrespective of the type of device involved, the individual circuits of the boards are tested for open-circuits and shorts. In open-circuit testing, the testing device determines whether an open circuit condition exists between two or more test point when the board's specifications dictate that the test points should be electrically connected. In short-circuit testing, the testing device determines whether an electrical connection exists between two or more test points when the board's specifications dictates that no electrical connection should exist. Typically, short circuit testing includes detection of both low and high impedance shorts.

Generally, both short-circuit and open-circuit testing are laborious and time-intensive processes. The presence or not of a short-circuit between each nominally discrete circuit must be determined, and each branch of a nominally single circuit must be tested for an open-circuit. In many modern circuit boards having a large number of separate and/or highly branched circuits, a high number of individual tests must be performed.

Attempts have been made to optimize the individual tests and to minimize the number needed to validate a given unpopulated circuit board. For example, short-circuit tests are performed with elevated voltages. Circuit boards thus tested tend to have high long-term reliability since the high voltage testing tends to exposed any transient short between the individual circuits. Testing only with conventional low test voltages make it nearly impossible to detect pseudo-shorts resulting from crosstalk between two circuits.

SUMMARY OF THE INVENTION

Unfortunately, even with high voltage testing techniques, board testing is slow. The high test voltages of, e.g., 250 Volts direct current (VDC) or 500 VDC need to be applied. Such voltages, however, cannot be applied abruptly to large circuits. The mutual inductance of these circuits limits the maximum current and thus the maximum rate of voltage change. Moreover, while being highly adaptable to different circuit board configurations, even between successive tests, finger tester devices can further slow the testing process. Their test fingers must be stepped between each board test point.

The present invention concerns a method of testing circuit boards, and associated device, in which selected circuits of a circuit board under test are intentionally short-circuited to form a single shorted circuit array. A high test voltage is then applied between the shorted circuit array and the remaining circuits of the board, successively to test the remaining circuits relative to the shorted circuit array. As a result, since the selected circuit can be the larger circuits on the board, their voltages are raised during the tests a relatively fewer number of times, a lengthy process for such circuits.

Preferably the circuits of the circuit board that are selected to form the shorted circuit array are grouped together and short-circuited with the test fingers of a finger testing device. The selected circuits are most commonly the ground and power circuits, which in many modern boards do not feature more than five power circuits or ground circuits and the circuits typically extend over the full length and width of the circuit board. In any event, the circuits selected to be shorted should be the larger circuits on the board with: inductances of more than 0.1 mH, preferably 1 mH to 5 mH, more than 10 contact points, or a capacitance of more than 10 pF.

In the preferred embodiments, the test voltages applied to the shorted circuits are high: greater than a 100 VDC, typically between 250 VDC and 500 VDC, or higher. Such high voltages making it possible to test resistors in the giga-ohm range.

Moreover, in accordance with the invention, an array of such large circuits is short-circuited by means of the inter-connected test fingers of a finger tester. The test voltage is then simultaneously elevated at all circuits short-circuited to each other, as a result of which a considerable saving in time is achieved as compared to discrete testing. Further, short-circuiting using the test fingers is easy to implement without additional hardware on conventional finger testers since the test fingers used for short-circuiting merely need be electrically connected to each other and permanently remain in contact with the shorted circuits in each case during testing. As a rule, the remaining circuits are tested one after the other relative to the shorted circuit array so that during testing only the test fingers contacting the test points of the remaining circuits are moved, with the electrically-connected test fingers connecting to the shorted circuit array remaining essentially stationary. Since the remaining circuits are tested relative to the shorted circuit array as a whole and not tested discretely relative to each circuit of the array, a substantial saving in time results.

In the preferred embodiment, circuits shorted into an array are first tested among each other for shorts. Specifically, testing power circuits relative to ground circuits is very important since a short between power circuits and ground circuits, especially in connection with signal circuits, may ruin the components of the populated circuit board.

Using a finger tester having several test fingers, more particularly at least four or preferably eight or more test fingers, the method in accordance with the invention is implemented much more quickly and with a higher reliability in high voltage testing than in conventional test methods. In addition since the test fingers for the shorted circuit array remain stationary during testing, controlling finger movement is substantial simplified.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
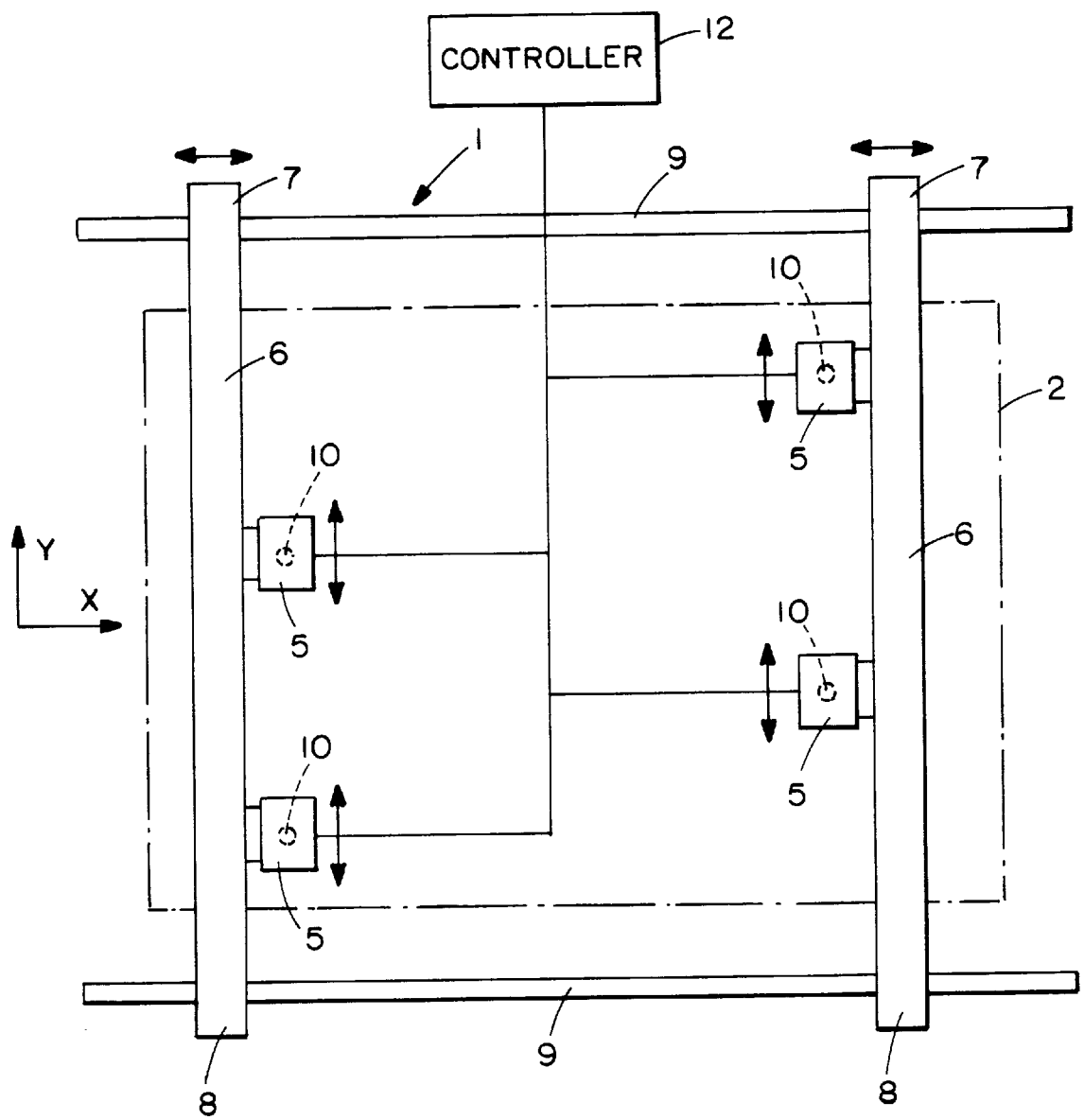
FIG. 1 is a top plan view of a finger tester used in conjunction with the present invention.

FIG. 1 shows a finger testing device 1 to which the principles of the present invention are applied. An example of such a device is disclosed in German Patent Application DE 41 09 684 A1, which is incorporated herein in its entirety by this reference.

As common in finger testing devices, positioning elements 5 move in the Y-axis direction on cross beams 6 via actuators in the positioning elements. Guide rails 9 support the respective ends of the cross beams 6 and enable the cross beams 6 to move in the X-axis direction using a second set of actuators. The combination of Y-axis movement of the positioning elements 5 and X-axis movement of cross beams 6 enable four test fingers 10 of the respective positioning elements 5 to be positioned within the test area 2 under the direction of a controller 12. Thus, any test points of a circuit board within the test area 2 are accessible by the combined X- and Y-axis movement.

Figure 2:
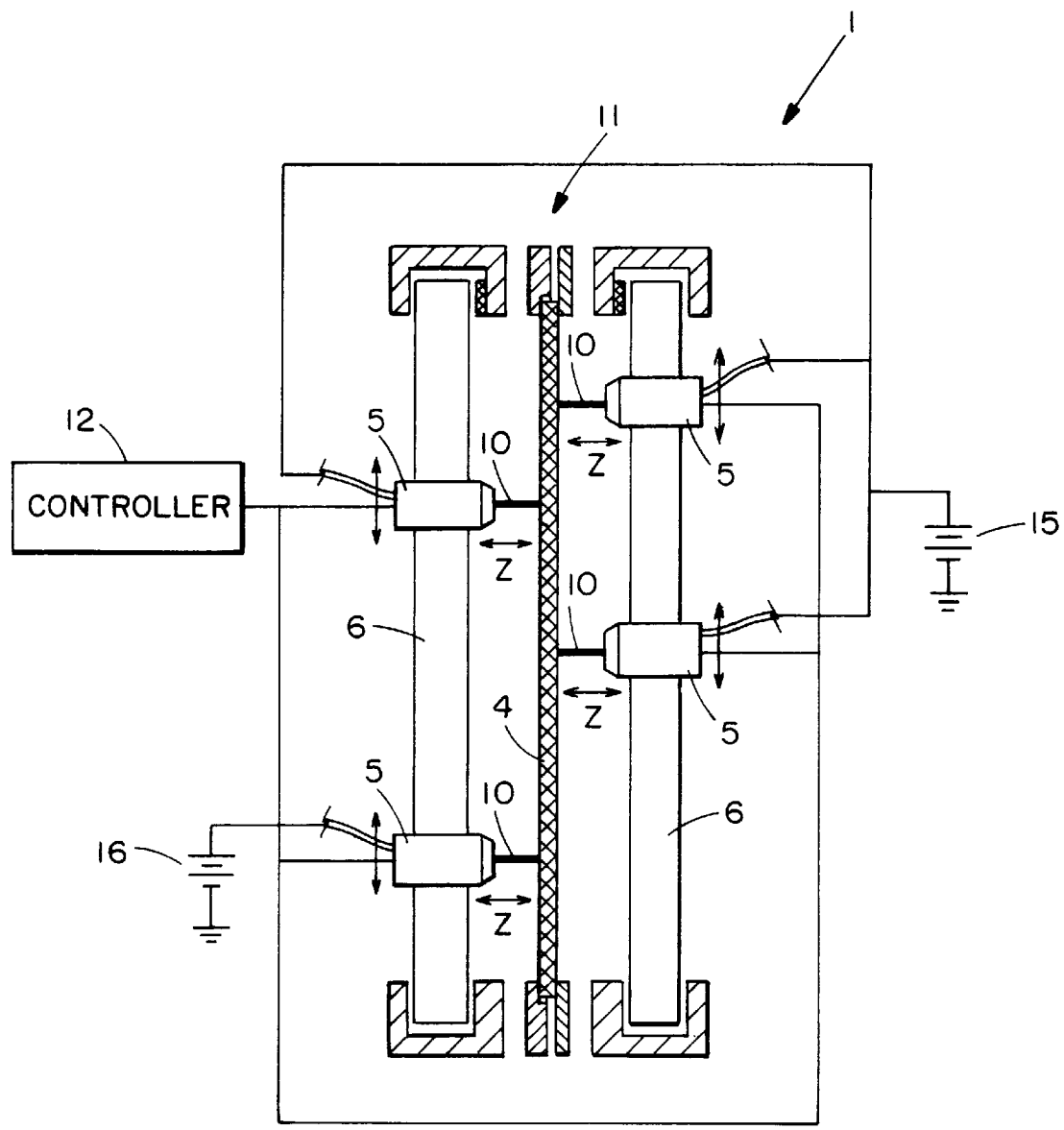
FIG. 2 is a side view of the finger tester that has been configured according to the invention.

FIG. 2 is a side view of the finger testing device 1. It illustrates that the system of positioning elements 5, cross beams 6, and guide rails 9 are duplicated for both sides of the circuit board 4 under test to enable access of test points on both sides of circuit board 4. Thus, a total eight (8) test fingers 10 are provided by the illustrated finger testing device, four (4) test fingers for each side of the circuit board 4.

As shown in the FIG. 2 view, the positioning elements extend their respective test fingers 10 in the Z-axis direction to contact test points of the board 4. The test fingers are then retracted to enable movement to the location of the next test point. The cross beams 6 are held in U-cross-sectioned guide rails 9. The circuit board 4 is held in the test area 2 by fixture 11.

The illustrated finger testing device is reconfigurable to support additional cross beams 6, each of which carries two positioning elements 5. Specifically, in one commercial product, up to eight (8) cross beams 6 are installed, for example, four on each pair of guide rails 9. This yields a finger testing device 1 with up to 16 test fingers.

Figure 3:
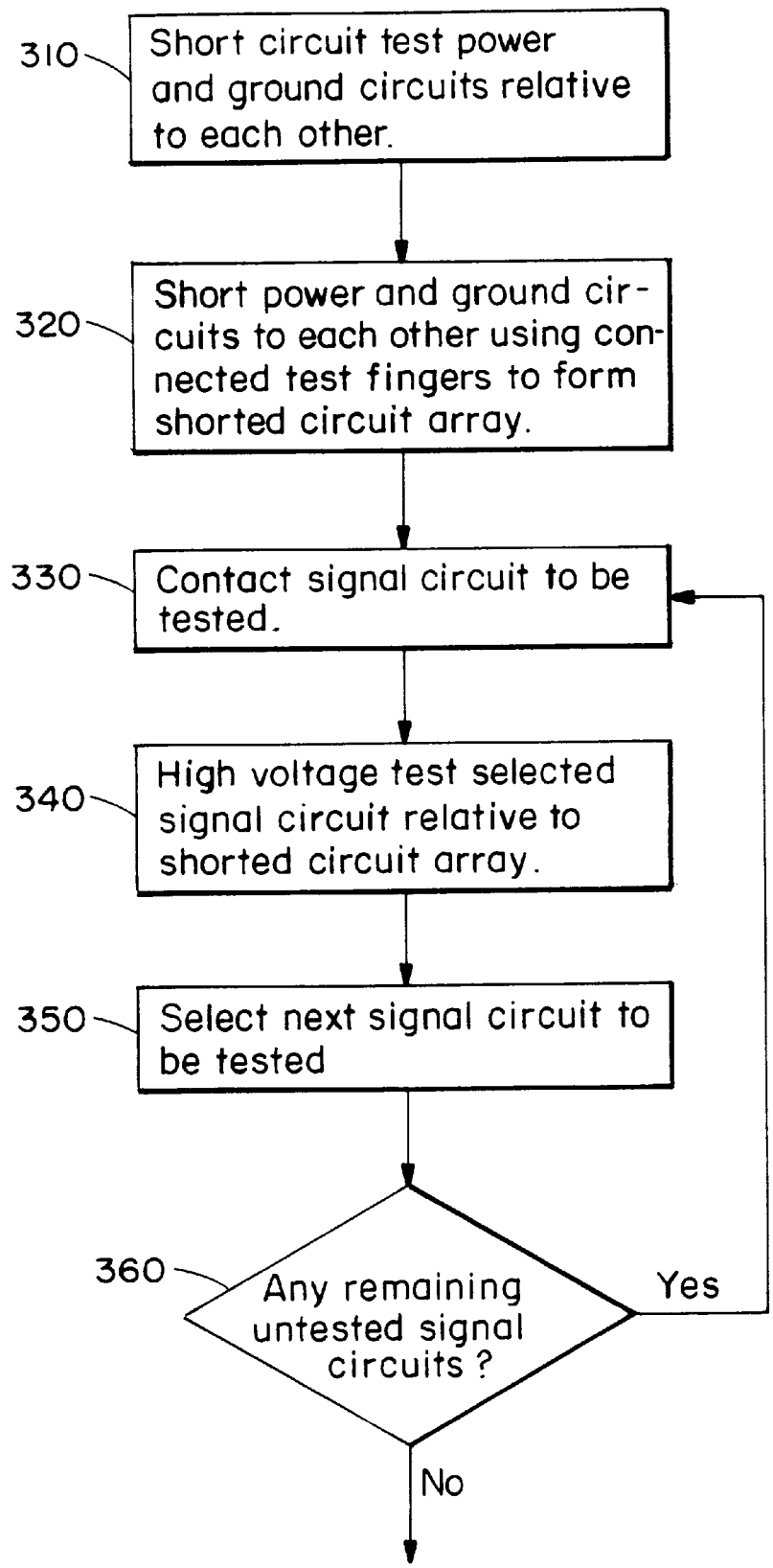
FIG. 3 is a process diagram showing the unpopulated circuit board testing procedure according to the present invention.

FIG. 3 is a process diagram showing the unpopulated circuit board testing procedure incorporating the principles of the present invention. Specifically, the procedure is discussed relative to an example circuit board having a total of five power and ground circuits.

In step 310, all five power and ground circuits are short-circuit tested relative to each other using a high voltage test. This test is also termed a dielectric test. As mentioned previously, elevating the voltage of these circuit to + or −500 VDC, for example, requires roughly 30 seconds due to the associated mutual inductances. A total of 10 separate tests are required to fully test for shortcircuits between these five power and ground circuits. Thus, the time required for these tests is roughly 300 seconds.

Once testing confirms that no short-circuits exists between the power and ground circuits, the testing of the power and/or ground circuits relative to all signal circuits begins. Specifically, the power and/or ground circuits tested in step 310 are shorted to each other in step 320 to form the shorted circuit array. This shorting is achieved by moving the test fingers to the contact points of the circuits and then electrically connecting the test fingers to each other and to the same voltage source 15 as illustrated schematically in FIG. 2.

The voltage of the source 15 is preferably a high voltage, 250 VDC, for example, but lower than, i.e., approximately one-half, of the total test voltage. Further, the voltage of the shorted circuit array preferably remains essentially constant throughout the subsequent serial tests of the remaining, most signal, circuits. Thus, there is no time lost waiting for the voltage of the shorted circuit array to reach the its nominal test voltage level after it is reached for the first test.

In step 330, at least one of the test fingers not used to contact the shorted power and ground circuits is contacted to a selected one of the remaining circuits, typically a signal circuit, i.e., a circuit intended to transmit information-bearing signals through the board. In step 340, a high test voltage of, e.g., 500 VDC is established between the selected circuit and the shorted circuit array of the power and/or ground circuits. The establishment of this high voltage test in the context of the instant example requires raising the voltage of the selected circuit to −250 VDC, see voltage source 16 in FIG. 2, relative to ground, since the array is already at +250 VDC. Many times, this test voltage splitting is necessary to support the high test voltages since the majority of finger testers are not designed for absolute voltages of up to 500 VDC.

Once the test voltage is established and the test completed, the next circuit to be tested relative to the shorted circuit array is selected in step 350 and process flow returns to step 330 as long as there are some remaining circuits to be tested in step 360.

Assuming that the circuit board to be tested comprises 2,000 signal circuits, then 2,000 tests are needed to test each signal circuit relative to the shorted circuit array. For test voltages totaling 500 VDC, each single test of a signal circuit takes roughly 15–20 seconds. This cycle time is largely dictated by the time required to raise the voltage of the selected signal circuit to the −250 VDC, and the time is less than that required for the power/ground circuits since the signal circuits tend to have lower associated inductances. In any event, the total time needed for testing is roughly 30,000 to 40,000 seconds.

In other embodiments, when test voltages are limited to less than 250 VDC or when the wiring and the electronics of the finger testing device are compatible with a maximum test voltage, the full test voltage relative to ground is applied to the shorted circuit array and the signal circuits tested with a test finger electrically connected to ground. This test finger, which has been electrically connected to ground, is displaced between the discrete signal circuits within fractions of a second without having to elevate the test voltage of the tested circuits, thus resulting in a further drastic reduction in the time needed for testing.

In contrast, conventional testing procedures test each power circuit or ground circuit discretely relative to the signal circuits would necessitate a total of 10,000 tests. For a test voltage of only 250 V, each discrete test would take roughly 10 seconds. Therefore, the total time needed would thus amount to roughly 100,000 seconds, which is substantially more than when the principles of the present invention are utilized.

A further advantage, in the case of finger testers, travel is optimized since the test fingers shorting the power and ground circuits need not be moved.

In the example embodiment, it was assumed that an array of power and ground circuits is short-circuited. It will be appreciated, however, that the invention is not restricted to this particular array. Circuits of any kind may be shorted to each other; but preferably the larger circuits of a circuit board are grouped together into the shorted circuit array. Further, several arrays of circuits are alternatively set up in some embodiments, which are tested one after the other relative to the remaining circuits.

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

What is claimed is:

1. A method of testing circuit boards including a plurality of circuits, wherein
    an array of circuits of a circuit board are short-circuited together by applying test fingers to electrically contact the array and electrically connecting the test fingers to each other; and
    further circuits are short-circuit tested relative to the array of circuits by applying a high test voltage between said further circuits and said array of circuits.

2. The method as set forth in claim 1, wherein said array of circuits, which are short-circuited by said test fingers, have an inductance of at least 0.1 mH.

3. The method as set forth in claim 2, wherein said array of circuits, which are short-circuited by said test fingers, are power circuits and/or ground circuits.

4. The method as set forth in claim 3, wherein said test voltage is at least about 500 V.

5. The method as set forth in claim 4, wherein said test voltage is applied to said short circuited array relative to ground and said further circuits are tested with a test finger electrically connected to ground.

6. The method as set forth in claim 5, wherein prior to short-circuiting said circuit array, the discrete circuits of said array are short-circuit tested relative to each other.

7. The method as set forth in claim 6, wherein several arrays of circuits are formed which are tested one after the other relative to the remaining circuits.

8. The method as set forth in claim 7, wherein said array of circuits, which are short-circuited by said test fingers, have an inductance of at least 0.1 mH.

9. The method as set forth in claim 1, wherein said array of circuits, which are short-circuited by said test fingers, have a capacitance of at least 10 pF.

10. The method as set forth in claim 1, wherein said array of circuits, which are short-circuited by said test fingers, comprise at least 10 contact points.

11. The method as set forth in claim 1, wherein said array of circuits, which are short-circuited by said test fingers, have a capacitance of at least 1 mF.

12. The method as set forth in claim 1, wherein said array of circuits, which are short-circuited by said test fingers, are power circuits and/or ground circuits.

13. The method as set forth in claim 1, wherein said test voltage is at least 250 V.

14. The method as set forth in claim 1, wherein said test voltage is at least about 500 V.

15. The method as set forth in claim 1, wherein said test voltage is applied to said short circuited array relative to ground and said further circuits are tested with a test finger electrically connected to ground.

16. The method as set forth in claim 1, wherein prior to short-circuiting said circuit array, the discrete circuits of said array are short-circuit tested relative to each other.

17. The method as set forth in claim 1, wherein several arrays of circuits are formed which are tested one after the other relative to the remaining circuits.

18. A finger testing device for testing circuit boards including power and/or ground circuits and signal circuits, the testing device comprising:
    at least two electrically connected test fingers for shorting together at least two power and/or ground circuits of a circuit board under test;
    at least a third test finger for accessing a test point of a signal circuit of the circuit board under test;
    a voltage source for establishing a test voltage between the power and/or ground circuits, which have been shorted together, and the signal circuit; and
    a controller for controlling the test fingers to short the two power and/or ground circuits together, the third test finger to access the test point of the signal circuit, and the voltage source to establish the test voltage.

* * * * *